United States Patent
Xu et al.

(10) Patent No.: US 9,715,567 B1
(45) Date of Patent: Jul. 25, 2017

(54) SYSTEMS AND METHODS FOR FULL-ORDER EQUIVALENT CIRCUIT APPROACH (ECA) MODELING OF LAYERED STRUCTURES

(71) Applicant: SAS IP, Inc., Cheyenne, WY (US)

(72) Inventors: Xin Xu, Pittsburgh, PA (US); J. E. Bracken, Harrison City, PA (US); Werner Thiel, Pittsburgh, PA (US)

(73) Assignee: Ansys, Inc., Canonsburg, PA (US)

( * ) Notice: Subject to any disclaimer, the term of this patent is extended or adjusted under 35 U.S.C. 154(b) by 73 days.

(21) Appl. No.: 14/796,427

(22) Filed: Jul. 10, 2015

Related U.S. Application Data

(60) Provisional application No. 62/025,357, filed on Jul. 16, 2014.

(51) Int. Cl.
G06F 17/00 (2006.01)
G06F 17/50 (2006.01)

(52) U.S. Cl.
CPC ...... G06F 17/5072 (2013.01); G06F 17/5077 (2013.01)

(58) Field of Classification Search
USPC ........................................................ 716/122
See application file for complete search history.

(56) References Cited

U.S. PATENT DOCUMENTS

| | | | | |
|---|---|---|---|---|
| 2004/0176938 A1* | 9/2004 | Gisin | ................ | G06F 17/5036 703/14 |
| 2009/0019403 A1* | 1/2009 | Iwaki | ................ | G06F 17/5036 716/136 |
| 2010/0094609 A1* | 4/2010 | Han | ................ | G06F 17/5036 703/14 |
| 2010/0218145 A1* | 8/2010 | Engin | ................ | G06F 17/5018 716/130 |

* cited by examiner

*Primary Examiner* — Mohammed Alam
(74) *Attorney, Agent, or Firm* — Jones Day

(57) ABSTRACT

Systems and methods are provided for generating an equivalent circuit model. RLGC parameters representing a segment of a layered structure of a specified length are received. The layered structure includes two conductors (also called planes) and at least one trace or a transmission line located between the two conductors. An admittance matrix corresponding to the segment is computed based at least in part on the received RLGC parameters. One or more loading parameters representing a loading of one of the two conductors due to the trace or traces are also computed, and a segment circuit model for the segment of the layered structure based at least in part on the admittance matrix and the one or more loading parameters.

26 Claims, 11 Drawing Sheets

SYSTEMS AND METHODS FOR FULL-ORDER EQUIVALENT CIRCUIT APPROACH (ECA) MODELING OF LAYERED STRUCTURES

CROSS REFERENCE TO RELATED APPLICATIONS

This application claims priority to U.S. Patent Application No. 62/025,357, entitled "System and Method for Full-Order Equivalent Circuit Approach (ECA) Modeling of Layered Structures," filed Jul. 16, 2014, the entirety of which is herein incorporated by reference.

TECHNICAL FIELD

The present disclosure relates generally to electronic circuits and, more specifically, to electromagnetic analysis of electronic circuits.

BACKGROUND

Circuitry that implements printed circuit boards (PCBs), very large scale integrated systems (VLSI), etc., often includes a strip of metal (also called a trace) disposed between two conductive layers/planes, (e.g., metallic layers/planes). For example, as shown in FIG. 1, one of the conductive layers/planes is called a power plane and the other layer/plane is called a ground plane. Often a substrate layer (e.g., a dielectric layer) separates the power plane from the trace and another substrate layer (e.g., another dielectric layer) separates the ground plane from the trace. Usually, a same material with a same composition is used to form both substrate layers. In determining electrical properties of the circuitry, electrical properties of such a layered structure including the power plane, the ground plane and the trace disposed in between are analyzed.

A modal decomposition technique is commonly applied in which transmission line modes are separated from parallel plate modes to analyze the electrical properties of the layered structure as shown in FIG. 1. An electromagnetic (EM) field between planes (e.g., a parallel plate mode) is modeled using a 2D full-wave solver in order to accommodate various geometries, specifically, power planes having non-rectangular shapes. In such modal decomposition solvers, a transmission line mode is represented by a two-port modal admittance matrix:

$$Y_{port} = \begin{bmatrix} Z^{-1}T\Lambda\coth(\Lambda l)T^{-1} & -Z^{-1}T\Lambda\csch(\Lambda l)T^{-1} \\ -Z^{-1}T\Lambda\csch(\Lambda l)T^{-1} & Z^{-1}T\Lambda\coth(\Lambda l)T^{-1} \end{bmatrix}$$

The transmission line parameters are extracted using a separate 2D transmission line solver. The coupling between a stripline (i.e., a transmission line) mode and a parallel plate waveguide mode can be analyzed by using a multi-conductor transmission line (MTL) theory in which the power plane is considered to be a wide trace. This classic, widely used modal decomposition technique is restricted, however, to situations in which a homogenous substrate (e.g., a dielectric material) is disposed between the power plane and the trace and between the ground plane and the trace.

In some circuit implementations, instead of substantially the same substrate material separating the trace from both the power plane and the ground plane, one or more dielectric or substrate layers separate the trace from the power plane, and one or more substrate layers separate the trace from the ground plane. The one or more substrates separating the power plane from the trace are different than the one or more substrates separating the ground plane from the trace. The substrates can be different in terms of materials, compositions, etc. The classical modal decomposition technique is generally not applicable to structures using non-homogeneous (also called inhomogeneous) substrates. One reason is, for traces in inhomogeneous material and coplanar waveguides, the classical method utilizing a two-port admittance matrix usually causes parasitic power plane resonances and can lead to an inaccurate transmission line model.

A strict modal decomposition approach may accommodate inhomogeneous substrates (e.g., B J. Yang, M. Swaminathan, "Simple Equivalent Circuit Model of a Stripline in Inhomogeneous Dielectric Media," IEEE Microwave and Wireless Comp. Letters, Vol. 19, No. 12, p 771, 2009, incorporated by reference in its entirety herein), but this technique is limited to rectangular power planes only, and is not applicable for analysis/simulation of the EM field between the power plane and the ground plane that have shapes other than simple rectangles which are increasingly employed in the fabrication of circuitry. In another approach (e.g., E. Engin, W. John, G. Sommer, W. Mathis, H. Reichl, "Modeling of Striplines Between a Power and Ground Plane," IEEE Trans. Adv. Packag., vol. 29, no. 3, p 415, 2006, incorporated by reference in its entirety herein), correction terms are added to the modal decomposition to account for inhomogeneity, but significant inaccuracies may be present in the simulation/analysis with the addition of the correction terms.

SUMMARY

In accordance with certain embodiments, systems and methods are provided for generating an equivalent circuit model. An example method for generating an equivalent circuit model includes: receiving, in one or more computer-readable storage media, RLGC parameters of a first segment of a layered structure of a specified length, the layered structure comprising a first conductive plane, a second conductive plane, and a first trace located between the first and second conductive planes; computing, using one or more data processors, an admittance matrix corresponding to the first segment based at least in part on the received RLGC parameters; generating, using the one or more data processors, at least one loading parameter representing a loading of the first conductive plane due to the first trace; and deriving, using the one or more data processors, a segment circuit model for the first segment of the layered structure based at least in part on the admittance matrix and the at least one loading parameter.

As an example, a processor-implemented system for generating an equivalent circuit model includes: one or more data processors and one or more non-transitory computer-readable storage media encoded with instructions for commanding the one or more data processors to execute operations. The operations include: receiving RLGC parameters of a first segment of a layered structure of a specified length, the layered structure comprising a first conductive plane, a second conductive plane, and a first trace located between the first and second conductive planes; computing an admittance matrix corresponding to the first segment based at least in part on the received RLGC parameters; generating at least one loading parameter representing a loading of the first conductive plane due to the first trace; and deriving a segment circuit model for the first segment of the layered structure based at least in part on the admittance matrix and the at least one loading parameter.

As another example, a non-transitory machine-readable storage medium is encoded with instructions for commanding one or more data processors to execute operations of a method for generating an equivalent circuit model. The method comprises: receiving RLGC parameters of a first segment of a layered structure of a specified length, the layered structure comprising a first conductive plane, a second conductive plane, and a first trace located between the first and second conductive planes; computing an admittance matrix corresponding to the first segment based at least in part on the received RLGC parameters; generating at least one loading parameter representing a loading of the first conductive plane due to the first trace; and deriving a segment circuit model for the first segment of the layered structure based at least in part on the admittance matrix and the at least one loading parameter.

DETAILED DESCRIPTION

An Equivalent Circuit Approach (ECA) can be implemented for circuit modeling, such as modeling microstrip lines, striplines (i.e., transmission lines), and coplanar waveguides in a layered circuit structure (e.g., PCB). The ECA uses equivalent circuits to approximate an extra loading to a finite-element-method (FEM) matrix due to the presence of one or more traces (e.g., one or more transmission lines). In ECA, a transmission line is discretized into small segments, e.g., segments of length that is $\frac{1}{16}^{th}$, $\frac{1}{32}^{nd}$, etc., of the wavelength of a signal carried by the transmission line. The discretized segments are represented by their equivalent circuit elements including resistance (R), inductance (L), capacitance (C), and conductance (G), i.e., RLCG parameters. However, compared to the classic modal decomposition method, the ECA may introduce a discretization error which may degrade the accuracy of simulation/analysis, especially for long transmission lines.

Figure 2:
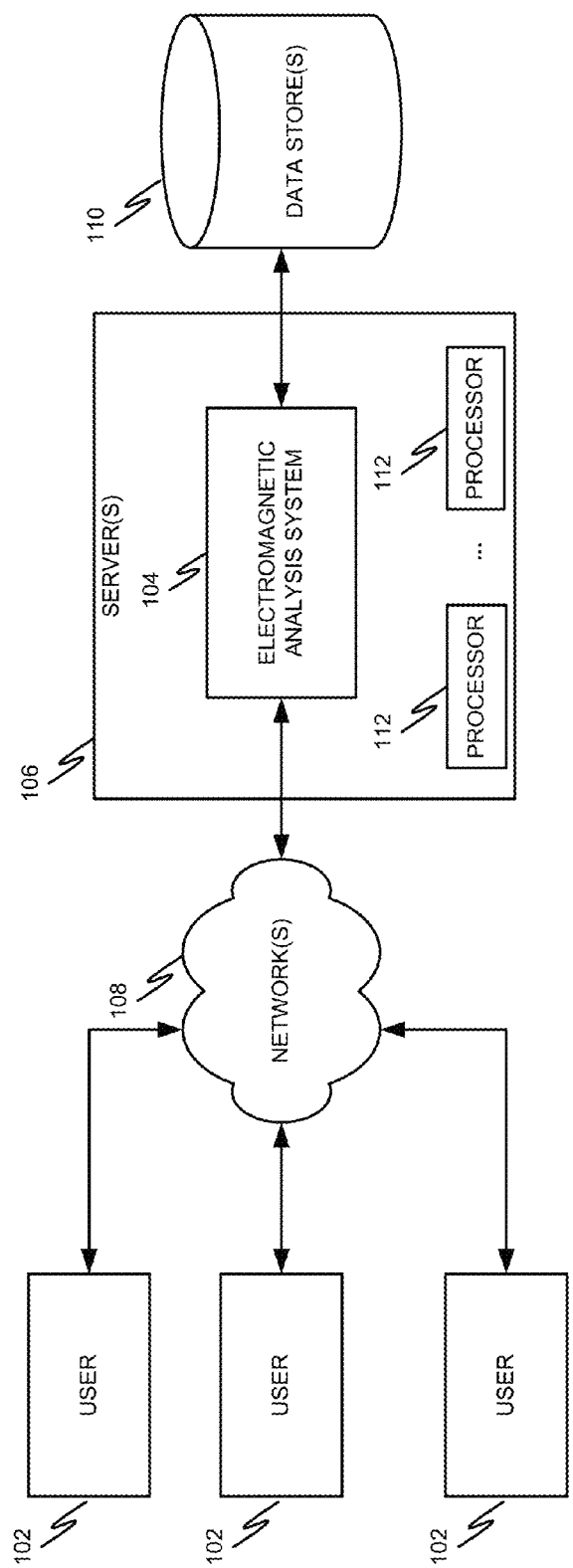
FIG. 2 depicts an example computer-implemented environment wherein users can interact with an electromagnetic analysis system hosted on one or more servers through a network.

FIG. 2 depicts an example computer-implemented environment wherein users 102 can interact with an electromagnetic analysis system 104 hosted on one or more servers 106 through a network 108. As shown in FIG. 2, the users 102 can interact with the electromagnetic analysis system 104 through a number of ways, such as over one or more networks 108. One or more servers 106 accessible through the network(s) 108 can host the electromagnetic analysis system 104. The one or more servers 106 can also contain or have access to one or more data stores 110 for storing data for the electromagnetic analysis system 104. The one or more servers 106 implement one or more data processors 110. For example, the data processors 110 can be configured for parallel computing.

Figure 1:
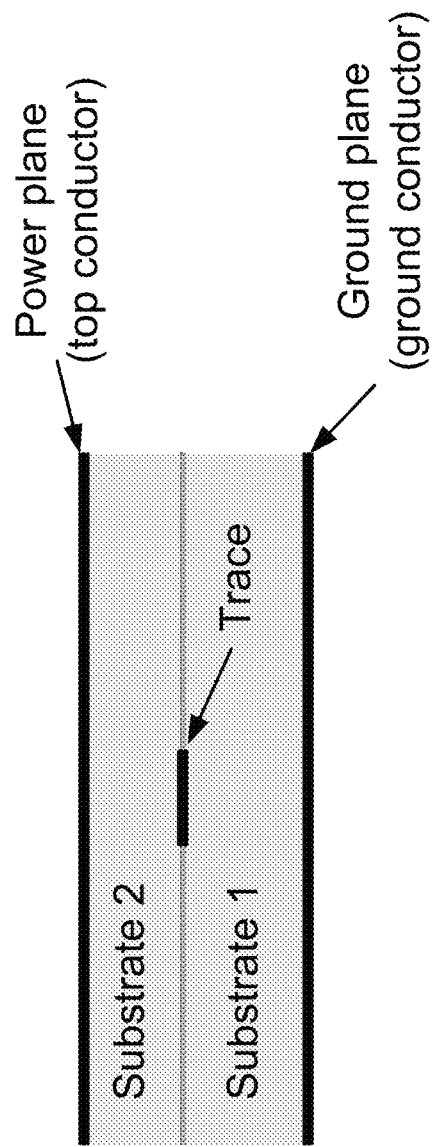
FIG. 1 depicts an example diagram showing a layered structure.
Figure 3:
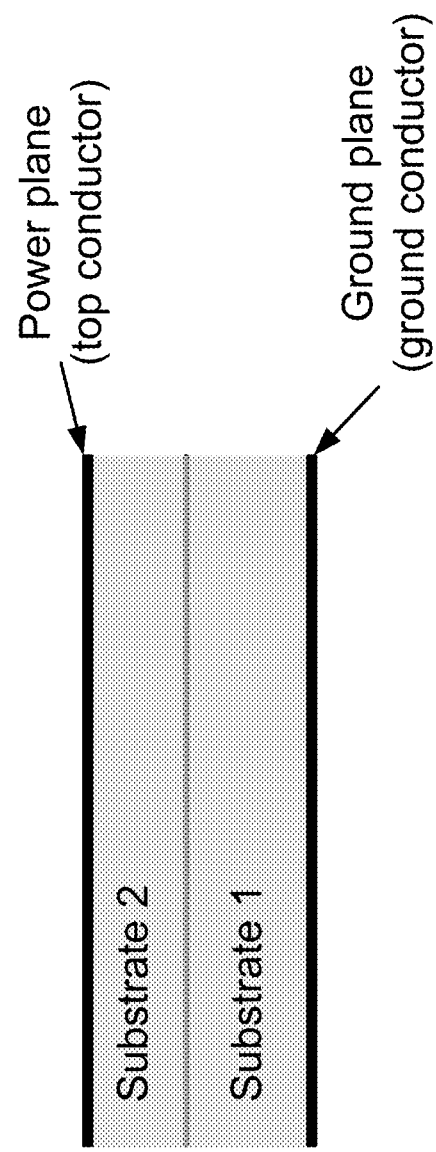
FIG. 3 depicts an example diagram showing a parallel plate system.
Figure 4:
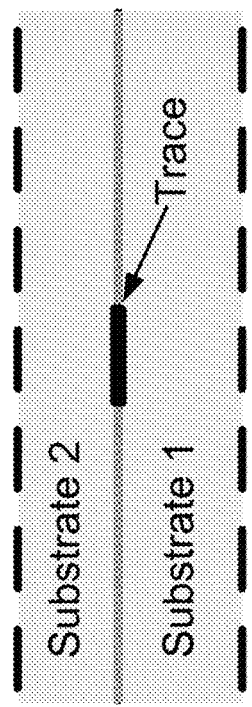
FIG. 4 depicts an example diagram showing a stripline system.

The electromagnetic analysis system 104 implements an equivalent circuit approach (e.g., high order or full order) which is not limited by dielectric choices and produces accurate results. Specifically, the electromagnetic analysis system 104 can assist the users 102 to model a three-conductor transmission line system (e.g., as shown in FIG. 1) as a parallel plate system (e.g., as shown in FIG. 3) loaded with a stripline system (e.g., as shown in FIG. 4). For example, the electromagnetic analysis system 104 can assist the users 102 to model the parallel plate system as an FEM system to obtain a voltage between the power plane (the top conductor) and the ground plane (the ground conductor) across the whole parallel plate region as shown in FIG. 3. The electromagnetic analysis system 104 that characterizes the stripline system independently generates an equivalent circuit model for the stripline system and adds the equivalent circuit model into the FEM system as additional loads. Then, the electromagnetic analysis system 104 can assist the users 102 to solve the combined system together to obtain a solution for the three-conductor transmission line system.

In some embodiments, the electromagnetic analysis system 104 meshes the parallel plate region (e.g., as shown in FIG. 3) between the power plane and the ground plane and fills an FEM matrix accordingly to model the parallel plate system as an FEM system. Moreover, the electromagnetic analysis system 104 extracts RLCG parameters associated with the transmission line (e.g., as shown in FIG. 4) and generates an equivalent circuit model based on the RLCG parameters. Then, the electromagnetic analysis system 104 fills the equivalent circuit model into the FEM matrix. Finally, the electromagnetic analysis system 104 solves the equivalent circuit loaded FEM matrix equation for the three-conductor transmission line system.

In certain embodiments, the electromagnetic analysis system 104 can assist the users 102 to model the three-conductor transmission line system (e.g., as shown in FIG. 1) using numerical analysis techniques other than the finite element method, such as the finite difference method, finite difference time domain, finite volume method, etc.

Figure 5:
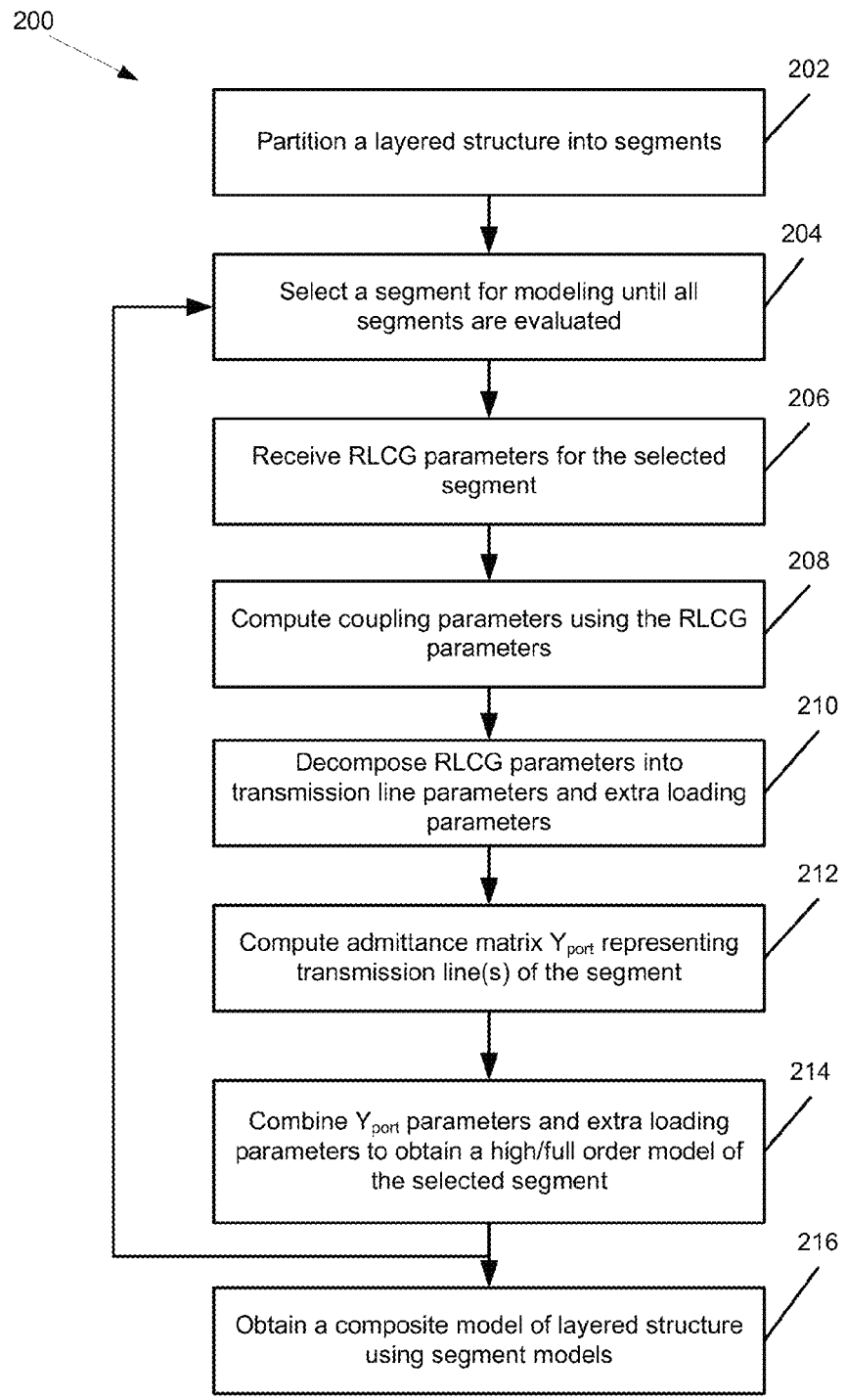
FIG. 5 depicts an example flow chart for equivalent circuit modeling.

FIG. 5 depicts an example flow chart for equivalent circuit modeling. As shown in FIG. 5, an equivalent circuit model is generated for a layered structure that includes a power plane, one or more traces, and a ground plane of length l. With reference to FIG. 5, in a process 200, a layered structure that includes a power plane, one or more traces, and a ground plane of length l is partitioned or discretized into several segments of length Δl in step 202. One of the segments is selected for modeling thereof in step 204. In step 206, RLCG parameters, such as resistance (R), inductance (L), capacitance (C), and conductance (G) parameters, are received for the selected segment. For example, the inductance parameter and the capacitance parameter are determined as follows:

$$L = \begin{bmatrix} L_{pp} & L_{pt} \\ L_{tp} & L_{tt} \end{bmatrix} \text{ and } C = \begin{bmatrix} C_{pp} & C_{pt} \\ C_{tp} & C_{tt} \end{bmatrix}$$

where p represents the power plane (e.g., the top conductor), and t represents the trace. For a lossless system, R and G are all zero. The calculation can be carried out with only L and C. For a lossy system, R, L, G and C always appear in pairs as R+jωL and G+jωC. All derivations for a lossless system can be applied to a lossy system by making the substitution, L→R/jω+L and C→G/jω+C. In the following derivations, the above substitution is implied wherever necessary.

Using the RLCG parameters, an inductive coupling parameter $\alpha_L$ and/or a capacitive coupling parameter $\alpha_C$ are computed in step 208. In one embodiment, the coupling parameters can be computed as $\alpha_L{}^T = L_{pp}{}^{-1}L_{pt}$; $\alpha_C = C_{tt}{}^{-1}C_{tp}$. The values $L_{pp}{}^{-1}$, $L_{pt}$, $C_{tt}{}^{-1}$, $C_{tp}$ can be derived from the received RLCG parameters. The RLCG parameters are then decomposed to produce transmission line parameters and extra loading parameters, in step 210. For example, $$C = \begin{bmatrix} C_p & 0 \\ 0 & 0 \end{bmatrix} + \begin{bmatrix} \alpha_C^T C_s \alpha_C & -\alpha_C^T C_s \\ -C_s \alpha_C & C_s \end{bmatrix}$$

$$L^{-1} = \begin{bmatrix} L_p^{-1} & 0 \\ 0 & 0 \end{bmatrix} + \begin{bmatrix} \alpha_L^T L_s^{-1} \alpha_L & -\alpha_L^T L_s^{-1} \\ -L_s^{-1} \alpha_L & L_s^{-1} \end{bmatrix}$$

where $C_s$ and $L_s^{-1}$ are the transmission line parameters and the other terms involving $\alpha_L$ and $\alpha_C$ are the extra loading parameters. $C_p$ and $L_p^{-1}$ are the parameters for the parallel plate structure formed by the power and ground planes. The extra loading parameters are based on the inductive and/or capacitive coupling parameters computed in step 208. In some embodiments, the computation of the coupling parameters can be combined with the computation of the extra loading parameters in the decomposition step 210.

Alternative methods can be used for calculating the coupling parameters $\alpha_L$ and/or $\alpha_C$. In one embodiment, $C_{tt}$ and $C_{tp}$ or their equivalent quantities can be calculated based on the stripline model (e.g., as shown in FIG. 4). The capacitive coupling parameter can then be computed as $\alpha_C = C_{tt}^{-1} C_{tp}$. To compute $\alpha_L$, a new stripline structure is created by replacing the substrates in the original stripline (as shown in FIG. 4) with free space. $C_{tt}'$ and $C_{tp}'$ or their equivalent quantities can be calculated for the new stripline structure. A new capacitive coupling parameter for the new stripline structure can be calculated as $\alpha'_C = C'_{tt}{}^{-1} C'_{tp}$. For non-magnetic substrates, $\alpha_L = \alpha'_C$.

An admittance matrix (e.g., a $Y_{port}$ matrix) corresponding to the transmission line(s) portion(s) of the selected segment of the layered structure is computed in step 212. For example, for a segment of length l of a transmission line, the corresponding $Y_{port}$ matrix can be written as:

$$Y_{port} = \begin{bmatrix} Z^{-1} T \Lambda \coth(\Lambda l) T^{-1} & -Z^{-1} T \Lambda \operatorname{csch}(\Lambda l) T^{-1} \\ -Z^{-1} T \Lambda \operatorname{csch}(\Lambda l) T^{-1} & Z^{-1} T \Lambda \coth(\Lambda l) T^{-1} \end{bmatrix}$$

Where $Z = j\omega L_s$; $Y = j\omega C_s$; T contains the eigenvectors of ZY; and $\Lambda^2$ contains eigenvalues of ZY. As an example, the transmission line $Y_{port}$ matrix may not be readily used to model the selected segment of the layered structure. Instead, in step 214, the $Y_{port}$ matrix is combined with the extra loading parameters computed in the step 210, to obtain a high or full order model of the selected segment.

Thereafter, the high/full-order model for the selected segment of the layered structure is combined with a parallel-plate model of the encompassing power and ground planes in the step 214. The steps 104-114 can be repeated for all of the segments. The models of the different segments can be combined in step 216 to obtain a composite model of the layered structure. Such a composite model can be analyzed and/or simulated, or can be integrated with a model of a system that includes the layered structure.

If the substrate separating the trace and the power plane is substantially the same as the substrate separating the trace and the ground plane, the values of $\alpha_L$ and $\alpha_C$ are about the same. If the two substrates are different, however, the values of $\alpha_L$ and $\alpha_C$ can be different. By using the $Y_{port}$ parameters instead of using Z and Y values computed directly from the RLCG parameters in a zero-order model, discretization errors in analyzing a three or more layer structure discretized into several segments can be eliminated or at least reduced substantially. The discretization allows for modeling of power and/or ground planes having non-rectangular shapes. Moreover, the decomposition using the inductive and capacitive coupling parameters allows for modeling where the substrate separating the power plane and the trace and the substrate separating the trace and the ground plane are different. For example, the two substrates can include different materials or may have different compositions.

Figure 6:
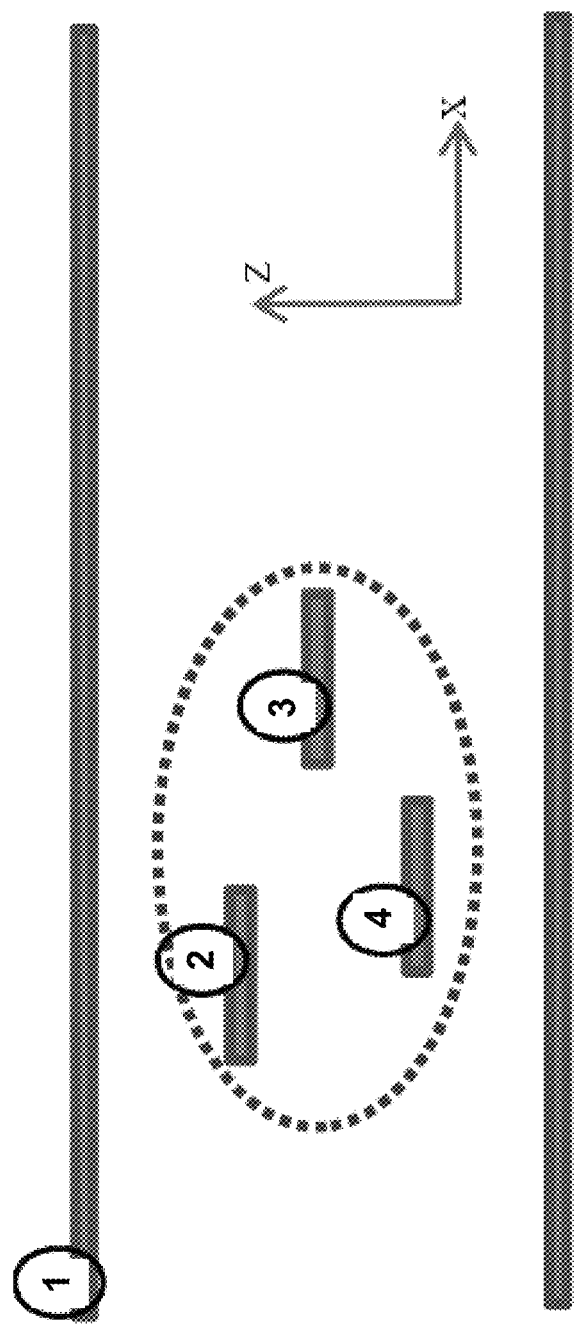
FIG. 6 depicts an example diagram showing a layered structure.

FIG. 6 depicts an example diagram showing a layered structure. As shown in FIG. 6, the layered structure includes one or more traces embedded in a homogenous substrate that is disposed between two conductor plates/layers (e.g., a power plane and a ground plane). A modal decomposition approach can be implemented to provide a good approximation for simulating signal relations between two ends of the striplines. The wavelength of signals applied to the one or more traces may be much longer than the distance between the plates. Under these circumstances, the parallel plate mode and the stripline modes can be decomposed. However, if the substrate disposed between the two conductor plates or layers is not homogenous, i.e., dielectric constants of different layers of the substrate are different, modal decomposition is not directly applicable.

The electric field (e.g., in a parallel plate mode) has only a z component if there are no traces between the plates (e.g., the power plane and the ground plane), and the electric field can be solved using 2D FEM. When one or more parallel traces are added between the plates (e.g., the power plane and the ground plane), additional field distribution is introduced. The additional field distribution can be transverse to a longitudinal direction of the traces, which is the signal propagation direction, and these transverse electromagnetic mode (TEM) fields correspond to the transmission line modes.

The layered structure, as shown in FIG. 6, can be considered as a transmission line problem with several conductors. The bottom conductor is assumed to be grounded (e.g., the ground plane). The per-unit-length (PUL) parameters of the (n+1)-conductor transmission line are given by n×n matrices:

$$L = \begin{bmatrix} L_{pp} & L_{pt} \\ L_{tp} & L_{tt} \end{bmatrix} \text{ and } C = \begin{bmatrix} C_{pp} & C_{pt} \\ C_{tp} & C_{tt} \end{bmatrix}$$

where $L_{tt}$ and $C_{tt}$ are $(n-1) \times (n-1)$ matrices. Let $V_p$ and $I_p$ be the voltage and current for the parallel plate mode. Let $V_s$ and $I_s$ be the voltage and current for the stripline modes. The total fields are related to the decomposed field modes as follows:

$$V = \begin{bmatrix} I & 0 \\ \alpha_C & I \end{bmatrix} \begin{bmatrix} V_p \\ V_s \end{bmatrix} \text{ and } I = \begin{bmatrix} I & -\alpha_L^T \\ 0 & I \end{bmatrix} \begin{bmatrix} I_p \\ I_s \end{bmatrix}$$

The PUL line parameters for the decomposed field modes are given as follows:

$$L_{modal} = \begin{bmatrix} I & 0 \\ -\alpha_C & I \end{bmatrix} \begin{bmatrix} L_{pp} & L_{pt} \\ L_{tp} & L_{tt} \end{bmatrix} \begin{bmatrix} I & -\alpha_L^T \\ 0 & I \end{bmatrix} =$$

$$\begin{bmatrix} L_{pp} & L_{pt} - L_{pp}\alpha_L^T \\ L_{tp} - \alpha_C L_{pp} & L_{tt} - \alpha_C L_{pt} - L_{tp}\alpha_L^T + \alpha_C L_{pp}\alpha_L^T \end{bmatrix}$$

$$C_{modal} = \begin{bmatrix} I & \alpha_L^T \\ 0 & I \end{bmatrix} \begin{bmatrix} C_{pp} & C_{pt} \\ C_{tp} & C_{tt} \end{bmatrix} \begin{bmatrix} I & 0 \\ \alpha_C & I \end{bmatrix} =$$

$$\begin{bmatrix} C_{pp} + \alpha_L^T C_{tp} + (C_{pt} + \alpha_L^T C_{tt})\alpha_C & C_{pt} + \alpha_L^T C_{tt} \\ C_{tt} + C_{tt}\alpha_C & C_{tt} \end{bmatrix}$$

For a homogenous substrate (e.g., a homogeneous dielectric) across multiple layers, modal decomposition can be performed to determine $\alpha_L^T = L_{pp}^{-1} L_{pt}$ and $\alpha_C = -C_{tt}^{-1} C_{tp}$, and $\alpha_L = \alpha_C$. These coefficients can be obtained if the following modal quantities are diagonal.

$$L_{modal} = \begin{bmatrix} L_{pp} & L_{pt} - L_{pp}\alpha_L^T \\ L_{tp} - \alpha_C L_{pp} & L_{tt} - \alpha_C L_{pt} - L_{tp}\alpha_L^T + \alpha_C L_{pp}\alpha_L^T \end{bmatrix} =$$

$$\begin{bmatrix} L_{pp} & 0 \\ 0 & L_{tt} - L_{tp}\alpha_L^T \end{bmatrix}$$

$$C_{modal} = \begin{bmatrix} C_{pp} + \alpha_L^T C_{tp} + (C_{pt} + \alpha_L^T C_{tt})\alpha_C & C_{pt} + \alpha_L^T C_{tt} \\ C_{tp} + C_{tt}\alpha_C & C_{tt} \end{bmatrix} =$$

$$\begin{bmatrix} C_{pp} - \alpha_C^T C_{tt}^{-1}\alpha_C & 0 \\ 0 & C_{tt} \end{bmatrix}$$

The modal quantities for inductance and capacitance are found to be:

$L_p = L_{pp}$ $L_s = L_{tt} - L_{tp}\alpha_L^T$ $C_p C_{pp} - \alpha_C^T C_{tt}\alpha_C$ $C_s = C_{tt}$ The values $$\begin{bmatrix} L_{pp} & L_{pt} \\ L_{tp} & L_{tt} \end{bmatrix}$$

and $$\begin{bmatrix} C_{pp} & C_{pt} \\ C_{tp} & C_{tt} \end{bmatrix}$$

which correspond to a segment of the layered structure to be analyzed, can be received from an analyzer that analyzes a cross-section of a multi-conductor transmission-line-system geometry. Using these values, $\alpha_L^T = L_{pp}^{-1} L_{pt}$ and $\alpha_C = -C_{tt}^{-1} C_{tp}$ can be computed.

If the substrate(s) (e.g., the dielectric layers) are inhomogeneous, $\alpha_L$ and $\alpha_C$ are not the same, in certain embodiments. As a result, the choices of $\alpha_L^T = L_{pp}^{-1} L_{pt}$ and $\alpha_C = -C_{tt}^{-1} C_{tp}$ do not diagonalize both L and C and, as such, the parallel plate mode and transmission line mode may not be readily decoupled, in some embodiments.

Using the modal quantities, a capacitance matrix can be determined as follows:

$$C = \begin{bmatrix} C_p + \alpha_C^T C_{tt}\alpha_C & -\alpha_C^T C_{tt} \\ -C_{tt}\alpha_C & C_s \end{bmatrix}$$

The inverse of an inductance matrix is:

$$L^{-1} = \begin{bmatrix} I & -\alpha_L^T \\ 0 & I \end{bmatrix} L_{modal}^{-1} \begin{bmatrix} I & 0 \\ -\alpha_C & I \end{bmatrix}$$

According to some embodiments, $$L_{modal}^{-1} = \begin{bmatrix} L_p & 0 \\ L_{tp} - \alpha_C L_{pp} & L_s \end{bmatrix}^{-1} = \begin{bmatrix} L_p^{-1} & 0 \\ -L_s^{-1}(\alpha_L - \alpha_C) & L_s^{-1} \end{bmatrix}$$

It can be shown that:

$$L^{-1} = \begin{bmatrix} I & -\alpha_L^T \\ 0 & I \end{bmatrix} \begin{bmatrix} L_p^{-1} & 0 \\ -L_s^{-1}(\alpha_L - \alpha_C) & L_s^{-1} \end{bmatrix} \begin{bmatrix} I & 0 \\ -\alpha_C & I \end{bmatrix}$$

$$= \begin{bmatrix} L_p^{-1} + \alpha_L^T L_s^{-1}\alpha_L & -\alpha_L^T L_s^{-1} \\ -L_s^{-1}\alpha_L & L_s^{-1} \end{bmatrix}$$

With the above-noted results, the ECA can be summarized as:

$$C = \begin{bmatrix} C_p & 0 \\ 0 & 0 \end{bmatrix} + \begin{bmatrix} \alpha_C^T C_s \alpha_C & -\alpha_C^T C_s \\ -C_s \alpha_C & C_s \end{bmatrix}$$

$$L^{-1} = \begin{bmatrix} L_p^{-1} & 0 \\ 0 & 0 \end{bmatrix} + \begin{bmatrix} \alpha_L^T L_s^{-1} \alpha_L & -\alpha_L^T L_s^{-1} \\ -L_s^{-1} \alpha_L & L_s^{-1} \end{bmatrix}$$

where the first terms of C and $L^{-1}$ are associated with the parallel plate mode (e.g., an FEM system) which can be modeled by a 2D FEM solver. The rest of the terms of C and $L^{-1}$ are considered to be connected with an FEM system in parallel, and these terms represent a transmission line and extra loadings due to mode coupling. In some embodiments, the parallel connection is distributed and is discretized, and the discretization density of the transmission line may not exceed the FEM discretization density in order for the coupling terms resolved by FEM to mesh adequately. Moreover, the discretization length may be shorter than the wavelength of the transmission line modes in certain embodiments.

The PUL line parameters of this transmission line and the extra loadings are given by:

$$L'^{-1} = \begin{bmatrix} 0 & 0 \\ 0 & L_s^{-1} \end{bmatrix} + \begin{bmatrix} \alpha_L^T L_s^{-1} \alpha_L & -\alpha_L^T L_s^{-1} \\ -L_s^{-1} \alpha_L & 0 \end{bmatrix}$$

$$C' = \begin{bmatrix} 0 & 0 \\ 0 & C_s \end{bmatrix} + \begin{bmatrix} \alpha_C^T C_s \alpha_C & -\alpha_C^T C_s \\ -C_s \alpha_C & 0 \end{bmatrix}$$

where the first terms of $L'^{-1}$ and $C'$ on the right hand side are the PUL parameters for the transmission line, which are represented using a high order ECA. The second terms of $L'^{-1}$ and $C'$ are the extra loadings due to the mode coupling, which can be represented using discrete circuit elements. For example, these second terms may be modeled using simple 0-order models. The decomposition of $L'^{-1}$ and $C'$, respectively, into two matrices each may be performed as described with reference to FIG. 5 at step 210.

Figure 7:
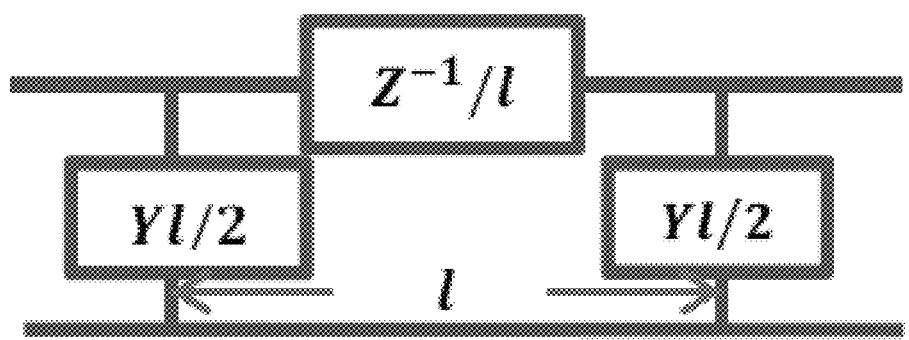
FIG. 7 depicts an example diagram showing an equivalent circuit for a segment of a transmission line.

An equivalent circuit of a section/segment of a transmission line is generally represented by an example equivalent circuit depicted in FIG. 7. In the equivalent circuit, $Z=j\omega L_s$ and $Y=j\omega C_s$. While this representation is accurate enough for some applications, it is observed to produce large error for long transmission lines. The error can be reduced by increasing the discretization density. However, the result converges slowly as the discretization density increases. That is, the system performance slows down. To reduce the discretization error, the model as shown in FIG. 7 can replaced with a full order representation for the section/segment of the transmission line.

A more accurate ECA can be obtained using a transmission line port admittance matrix $Y_{port}$ that represents the distributed line behavior of a section/segment. The port matrix, $Y_{port}$, can be obtained by solving the following Eigen value problem.

$$(ZY)T = T\Lambda^2$$

T contains the eigenvectors; and $\Lambda^2$ contains eigenvalues. The port matrix, $Y_{port}$ relating the end currents and voltages can be determined as follows:

$$Y_{port} = \begin{bmatrix} Z^{-1}T\Lambda\coth(\Lambda l)T^{-1} & -Z^{-1}T\Lambda\csch(\Lambda l)T^{-1} \\ -Z^{-1}T\Lambda\csch(\Lambda l)T^{-1} & Z^{-1}T\Lambda\coth(\Lambda l)T^{-1} \end{bmatrix}$$

Figure 8:
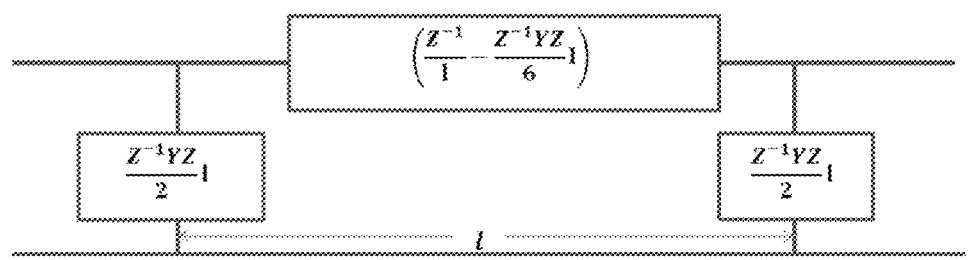
FIG. 8 depicts an example diagram showing an equivalent circuit for a first-order approximation of $Y_{port}$.

For example, assuming elements of matrix $\Lambda l$ are small, i.e., $[\Lambda l]_{ii} \ll 1$, a first order approximation for $Y_{port}$ can be determined. FIG. 8 depicts an example diagram showing an equivalent circuit for a first-order approximation of $Y_{port}$.

Figure 9:
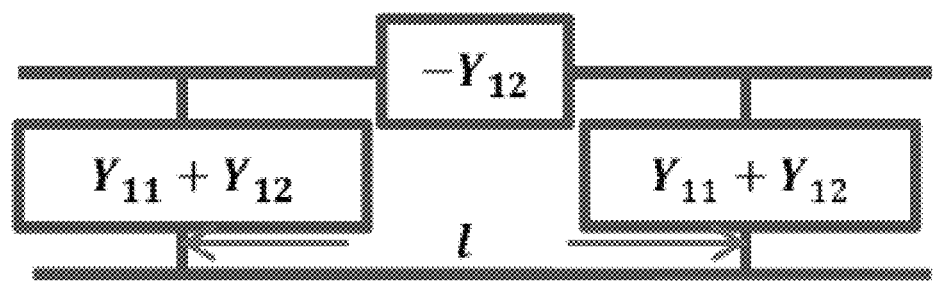
FIG. 9 depicts an example diagram showing an equivalent circuit for a full-order approximation of $Y_{port}$.

FIG. 9 depicts an example diagram showing an equivalent circuit for a full-order approximation of $Y_{port}$. The matrices $$\begin{bmatrix} \alpha_L^T L_s^{-1} \alpha_L & -\alpha_L^T L_s^{-1} \\ -L_s^{-1} \alpha_L & 0 \end{bmatrix}$$

and $$\begin{bmatrix} \alpha_C^T C_s \alpha_C & -\alpha_C^T C_s \\ -C_s \alpha_C & 0 \end{bmatrix}$$

represent mode coupling. The matrix elements can be implemented as simple circuit element loadings at discretization points of the transmission line.

In general, the procedure described above with reference to FIG. 5 can be repeated for several segments of the layered structure, so as to obtain a full-order ECA model of each segment. The models of the individual segments can then be combined to obtain a composite model of the layered structure. It should be understood that such layered structures are typically part of larger circuitry or system. As such, a composite model of the layered structure obtained using techniques described herein can be integrated with models of other components of the circuitry, obtained using known techniques, so as to obtain a model for the overall circuitry or the overall system. Such a model for the overall circuitry or the overall system can be analyzed/simulated using known analyzers/simulators. To this end, parameters such as S parameters, Y parameters, and/or Z parameters representing the circuitry/system model can be computed. Various embodiments described herein enable efficient and accurate system-level analysis/simulation, by providing to a suitable analyzer/simulator a model of a layered structure that includes inhomogeneous substrates and/or power and/or ground planes that have non-rectangular geometries.

Figure 10:
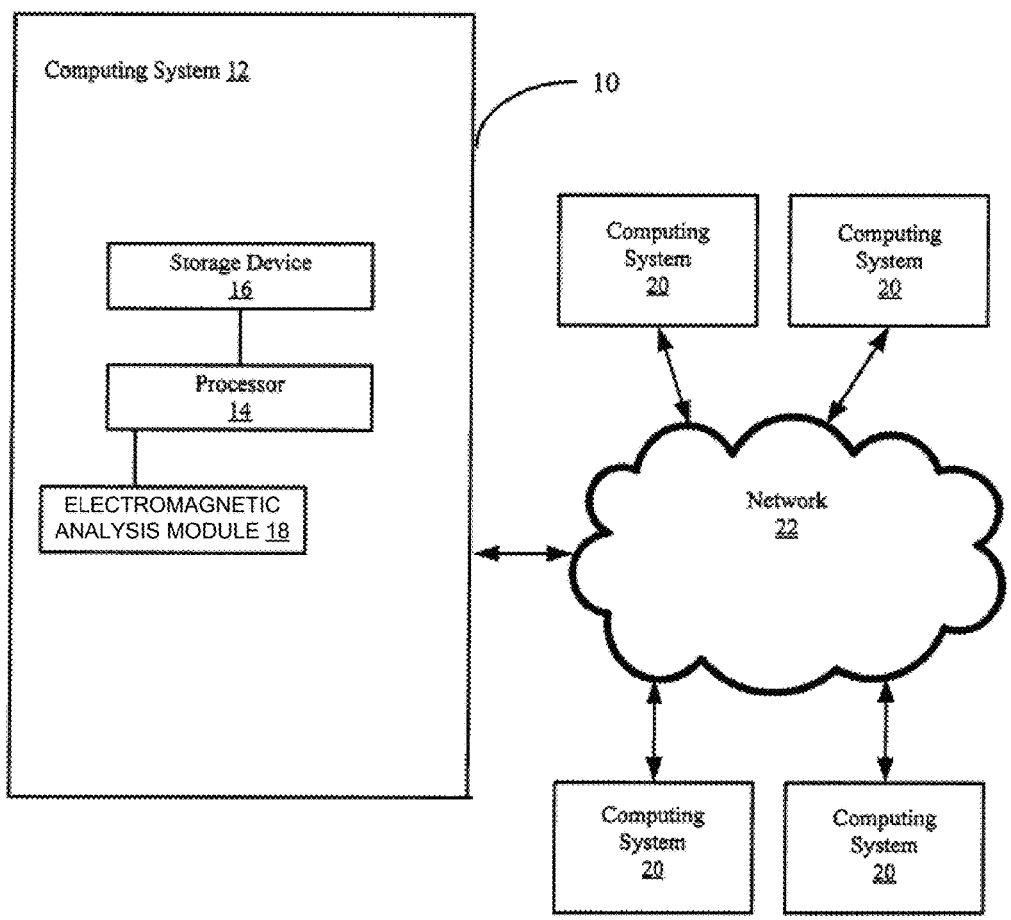
FIG. 10 depicts an example diagram showing a system for electromagnetic analysis.

FIG. 10 depicts an example diagram showing a system for electromagnetic analysis. As shown in FIG. 10, the system 10 includes a computing system 12 which contains a processor 14, a storage device 16 and an electromagnetic analysis module 18. The computing system 12 includes any suitable type of computing device (e.g., a server, a desktop, a laptop, a tablet, a mobile phone, etc.) that includes the processor 14 or provide access to a processor via a network or as part of a cloud based application. The electromagnetic analysis module 18 includes tasks and is implemented as part of a user interface module (not shown in FIG. 10).

Figure 11:
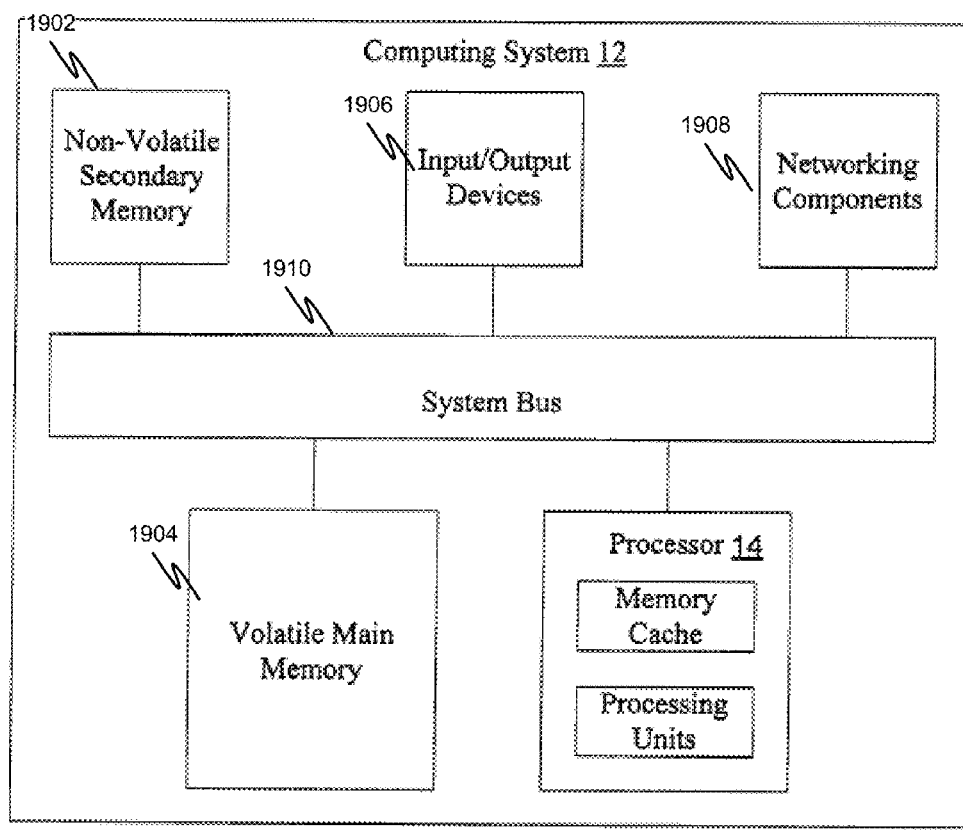
FIG. 11 depicts an example diagram showing a computing system for electromagnetic analysis.

FIG. 11 depicts an example diagram showing a computing system for electromagnetic analysis. As shown in FIG. 11, the computing system 12 includes a processor 14, memory devices 1902 and 1904, one or more input/output devices 1906, one or more networking components 1908, and a system bus 1910. In some embodiments, the computing system 12 includes the electromagnetic analysis module 18, and provides access to the electromagnetic analysis module 18 to a user as a stand-alone computer.

This written description uses examples to disclose the invention, including the best mode, and also to enable a person skilled in the art to make and use the invention. The patentable scope of the invention may include other examples. For example, the systems and methods may include data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of non-transitory computer-readable storage medium that is stored at a single location or distributed across multiple locations. The medium can include computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example, as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The invention claimed is:

1. A computer implemented method for generating an equivalent circuit model, the method comprising:
    receiving, in one or more computer-readable storage media, resistance, inductance, conductance, or capacitance ("RLGC") parameters of a first segment of a layered structure of a specified length, the layered structure comprising a first conductive plane, a second conductive plane, and a first trace located between the first and second conductive planes;
    computing, using one or more data processors, a relationship between end currents or end voltages of the first segment based at least in part on the received RLGC parameters;
    generating, using the one or more data processors, at least one loading parameter representing electromagnetic coupling between the first conductive plane and the first trace; and
    generating, using the one or more data processors, a segment circuit model for the first segment of the layered structure based at least in part on the generated relationship and the at least one loading parameter.

2. The method of claim 1, wherein at least one of the first conductive plane and the second conductive plane has a non-rectangular shape.

3. The method of claim 1, wherein the generated relationship is characterized as an admittance matrix comprising trans-admittance values.

4. The method of claim 3, wherein the admittance matrix comprises a zero-order admittance matrix or a first-order admittance matrix or a full-order admittance matrix.

5. The method of claim 1, wherein the at least one loading parameter comprises an inductive loading term or a capacitive loading term.

6. The method of claim 5, wherein the at least one loading parameter comprises a second loading term that is a capacitive loading term or an inductive loading term.

7. The method of claim 1, wherein:
    a first substrate is disposed between the first conductive plane and the first trace, and a second, different substrate is disposed between the first trace and the second conductive plane;
    the at least one loading parameter comprises an inductive loading parameter and a capacitive loading parameter that is different than the inductive loading parameter.

8. The method of claim 1, wherein:
    a second trace is located between the first and second conductive planes; and
    the at least one loading parameter comprises a vector loading parameter comprising a first element representing loading of the first conductive plane due to the first trace and a second element representing loading of the first conductive plane due to the second trace.

9. The method of claim 8, wherein the second trace is substantially coplanar with the first trace.

10. The method of claim 8, wherein the first and the second traces are located in different planes.

11. The method of claim 10, wherein:
    a first substrate is disposed between the first conductive plane and the first trace;
    a second substrate is disposed between the first trace and the second trace; and
    a third substrate is disposed between the second trace and the second conductive plane.

12. The method of claim 11, wherein a composition of at least a portion of the first substrate is different than a composition of at least a portion of the second substrate.

13. The method of claim 11, wherein a composition of at least a portion of the second substrate is different than a composition of at least a portion of the third substrate.

14. The method of claim 11, wherein a composition of at least a portion of the first substrate is different than a composition of at least a portion of the third substrate.

15. The method of claim 1, further comprising:
    receiving in the storage media RLGC parameters of a second segment of the layered structure of the specified length; and
    repeating the computing, generating, and second generating steps to obtain a segment model for the second segment.

16. The method of claim 15, further comprising:
combining the segment models for the first and second segments to obtain a composite model of the layered structure; and
simulating behavior of circuitry comprising the layered structure, using the composite model.

17. The method of claim 16, further comprising computing at least one of S parameters, Y parameters, and Z parameters for the circuitry.

18. A processor-implemented system for generating an equivalent circuit model, the system comprising:
one or more data processors; and
one or more non-transitory computer-readable storage media encoded with instructions for commanding the one or more data processors to execute operations including:
receiving resistance, inductance, conductance, or capacitance ("RLGC") parameters of a first segment of a layered structure of a specified length, the layered structure comprising a first conductive plane, a second conductive plane, and a first trace located between the first and second conductive planes;
computing a relationship between end currents or end voltages of the first segment based at least in part on the received RLGC parameters;
generating at least one loading parameter representing electromagnetic coupling between the of the first conductive plane and the first trace; and
generating a segment circuit model for the first segment of the layered structure based at least in part on the generated relationship and the at least one loading parameter.

19. The system of claim 18, wherein the instructions are adapted for commanding the one or more data processors to execute further operations including:
receiving RLGC parameters of a second segment of the layered structure of the specified length; and
repeating the computing, generating, and deriving steps to obtain a segment model for the second segment.

20. The system of claim 19, wherein the instructions are adapted for commanding the one or more data processors to execute further operations including:
combining the segment models for the first and second segments to obtain a composite model of the layered structure; and
simulating behavior of circuitry comprising the layered structure, using the composite model.

21. A non-transitory machine-readable storage medium encoded with instructions for commanding one or more data processors to execute operations of a method for generating an equivalent circuit model, the method comprising:
receiving resistance, inductance, conductance, or capacitance ("RLGC") parameters of a first segment of a layered structure of a specified length, the layered structure comprising a first conductive plane, a second conductive plane, and a first trace located between the first and second conductive planes;
computing a relationship between end currents or end voltages of the first segment based at least in part on the received RLGC parameters;
generating at least one loading parameter representing electromagnetic coupling between the first conductive plane and the first trace; and
generating a segment circuit model for the first segment of the layered structure based at least in part on the generated relationship and the at least one loading parameter.

22. The computer implemented method of claim 1, wherein the relationship between end currents or end voltages corresponding to the first circuit is a data structure representing a port matrix that characterizes the relationship in terms of one or more of the RLGC parameters.

23. The computer implemented method of claim 22, wherein the port matrix characterizes the relationship between end currents or end voltages as a function of admittance parameters of the first segment.

24. The computer implemented method of claim 1, wherein the relationship between end currents or end voltages corresponding to the first segment is a data structure that represents a port matrix in terms of $Z=j\omega L_s$, $Y=j\omega C_s$; eigenvectors of ZY; and square roots of eigenvalues of ZY.

25. The computer implemented method of claim 1, wherein the RLGC parameters for the first segment characterize an (n+1)-conductor transmission line by a data structure representing an n×n matrix, wherein each of the n×n matrix elements include an (n−1)×(n−1) matrix.

26. The computer implemented method of claim 1 further comprising generating a discretized parallel plate mode model, wherein generating a segment circuit model for the first segment is further based on the parallel plate mode model.

* * * * *